(12) United States Patent
Kim et al.

(10) Patent No.: US 9,659,910 B1
(45) Date of Patent: May 23, 2017

(54) MANUFACTURING METHODS SEMICONDUCTOR PACKAGES INCLUDING THROUGH MOLD CONNECTORS

(71) Applicant: SK hynix Inc., Icheon-si, Gyeonggi-do (KR)

(72) Inventors: Jong Hoon Kim, Suwon-si (KR); Ki Jun Sung, Cheongju-si (KR); Young Geun Yoo, Icheon-si (KR); Hyeong Seok Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/167,383

(22) Filed: May 27, 2016

(30) Foreign Application Priority Data

Jan. 6, 2016 (KR) ........................ 10-2016-0001474

(51) Int. Cl.

| | |
|---|---|
| *H01L 21/00* | (2006.01) |
| *H01L 25/065* | (2006.01) |
| *H01L 25/00* | (2006.01) |
| *H01L 21/48* | (2006.01) |
| *H01L 21/56* | (2006.01) |
| *H01L 23/00* | (2006.01) |
| *H01L 21/3105* | (2006.01) |
| *H01L 23/498* | (2006.01) |
| *H01L 23/31* | (2006.01) |

(52) U.S. Cl.
CPC .... *H01L 25/0657* (2013.01); *H01L 21/31058* (2013.01); *H01L 21/486* (2013.01); *H01L 21/4853* (2013.01); *H01L 21/565* (2013.01); *H01L 23/3128* (2013.01); *H01L 23/49827* (2013.01); *H01L 23/49838* (2013.01); *H01L 24/17* (2013.01); *H01L 24/81* (2013.01); *H01L 25/50* (2013.01); *H01L 2224/16225* (2013.01); *H01L 2224/48091* (2013.01); *H01L 2224/48106* (2013.01); *H01L 2224/48227* (2013.01); *H01L 2225/0651* (2013.01); *H01L 2225/0652* (2013.01); *H01L 2225/06517* (2013.01); *H01L 2225/06548* (2013.01); *H01L 2225/06572* (2013.01); *H01L 2225/06586* (2013.01)

(58) Field of Classification Search
CPC ....................................................... H01L 23/04
See application file for complete search history.

(56) References Cited

U.S. PATENT DOCUMENTS

2014/0042608 A1\* 2/2014 Kim ........................ H01L 23/04
257/686

FOREIGN PATENT DOCUMENTS

| KR | 1020120127185 A | 11/2012 |
| KR | 1020140022255 A | 2/2014 |

\* cited by examiner

*Primary Examiner* — William Harriston
(74) *Attorney, Agent, or Firm* — William Park & Associates Ltd.

(57) ABSTRACT

A semiconductor package structure and a method for manufacturing the same are provided. According to the method, a first mold layer is formed to cover a first semiconductor chip and a first bumps. A portion of the first mold layer is removed to expose top portions of the first bumps and second bumps are disposed to be connected to each of the first bumps. A second mold layer is formed, and the second mold layer is recessed to form through mold connectors that substantially penetrate the second mold layer with the second bumps disposed on the first bumps.

19 Claims, 19 Drawing Sheets

MANUFACTURING METHODS SEMICONDUCTOR PACKAGES INCLUDING THROUGH MOLD CONNECTORS

CROSS-REFERENCE TO RELATED APPLICATION

The present application claims priority under 35 U.S.C 119(a) to Korean Patent Application No. 10-2016-0001474, filed on Jan. 6, 2016, which is herein incorporated by reference in its entirety.

BACKGROUND

1. Technical Field

Various embodiments of the present disclosure relate to a packaging technology and, more particularly, to semiconductor packages including through mold connectors (TMCs) and methods for manufacturing the same.

2. Related Art

As electronic systems become multi-functional, high capacity and small size, a technique to integrate a plurality of semiconductor devices in a single package structure has been required. Integrated package structures can be designed to reduce the entire size of the semiconductor device and to perform various functions. The integrated package structure can be exemplified by a package on package (PoP) structure in which a plurality of semiconductor packages are laminated. The PoP structure can integrate the semiconductor packages separately packaged to perform different functions into a single package structure by electrically connecting the semiconductor packages.

SUMMARY

According to an embodiment, there is provided a method for manufacturing a semiconductor package. The method includes disposing a first semiconductor chip and a plurality of first bumps on a first interconnection structure layer, forming a first mold layer to cover the first bumps and the first semiconductor chip, exposing top portions of the first bumps by selectively removing some portions of the first mold layer, disposing second bumps connected to the exposed first bumps, forming a second mold layer to cover the second bumps, exposing top portions of the second bumps by recessing the second mold layer, and laminating a second semiconductor chip to be electrically connected to the second bumps.

According to an embodiment, there is provided a semiconductor package. The semiconductor package includes a first semiconductor chip and a plurality of first bumps disposed on a first interconnection structure layer, a first mold layer including a first portion and a second portion that form a stepped shape, the first portion covering the first semiconductor chip, the second portion filling between the first bumps to expose top portions of the first bumps, second bumps connected to the exposed first bumps, a second mold layer filling between each of the second bumps and filling the stepped shape to leave exposed the top portions of the second bumps, and a second semiconductor chip laminated to be electrically connected to the second bumps.

According to an embodiment, there is provided a method for manufacturing a semiconductor package. The method includes forming a first mold layer burying a first semiconductor chip and a plurality of first bumps on a first interconnection structure layer, forming a plurality of trenches exposing top portions of the first bumps by selectively removing some portions of the first mold layer, forming a dielectric layer filling the trenches, forming opening holes exposing the top portions of the first bumps by selectively removing some portions of the dielectric layer, forming conductive vias connected to the first bumps by filling the opening holes, and laminating a second semiconductor chip electrically connected to the conductive vias.

According to an embodiment, there is provided a method for manufacturing a semiconductor package. The method includes forming a first mold layer to cover a first semiconductor chip and a plurality of first bumps spaced apart from the first semiconductor chip in a lateral direction, exposing top portions of the first bumps by selectively removing some portions of the first mold layer, disposing second bumps connected to the exposed first bumps, forming a second mold layer to cover the second bumps, and forming a through mold connector by recessing the second mold layer and by leaving exposed the top portions of the second bumps, the through mold connector including the second bumps disposed on the first bumps and substantially penetrating the first and second mold layers.

According to an embodiment, there is provided a semiconductor package. The semiconductor package includes a first mold layer including a first portion and a second portion, the first portion covering a first semiconductor chip, the second portion filling between a plurality of first bumps spaced apart from the first semiconductor chip in a lateral direction to expose top portions of the first bumps, and the first portion and the second portion forming a stepped shape, second bumps connected to the exposed first bumps, and a second mold layer filling between the second bumps to leave exposed the top portions of the second bumps and filling the stepped shape. The second bumps disposed on the first bumps form a through mold connector substantially penetrating the first and second mold layers.

According to an embodiment, there is provided a memory card including a semiconductor package. The semiconductor package includes a first semiconductor chip and a plurality of first bumps that are disposed on a first interconnection structure layer, a first mold layer including a first portion and a second portion that form a stepped shape, the first portion covering the first semiconductor chip, the second portion filling between the first bumps to expose top portions of the first bumps, second bumps connected to each of the exposed first bumps, a second mold layer filling between the second bumps and filling the stepped shape to leave exposed the top portions of the second bumps, and a second semiconductor chip laminated to be electrically connected to the second bumps.

According to an embodiment, there is provided a memory card including a semiconductor package. The semiconductor package includes a first mold layer including a first portion and a second portion, the first portion covering a first semiconductor chip, the second portion filling between first bumps to expose top portions of the first bumps spaced apart from the first semiconductor chip in a lateral direction, and the first portion and the second portion form a stepped shape, second bumps connected to the exposed first bumps, respectively, and a second mold layer filling between the second bumps and filling the stepped shape to leave exposed the top portions of the second bumps. The second bumps disposed on the first bumps form a through mold connector substantially penetrating the first and second mold layers.

According to an embodiment, there is provided an electronic system including a semiconductor package. The semiconductor package includes a first semiconductor chip and a plurality of first bumps that are disposed on a first interconnection structure layer, a first mold layer including a first portion and a second portion that form a stepped shape, the first portion covering the first semiconductor chip, the second portion filling between the first bumps to expose top portions of the first bumps, second bumps connected to each of the exposed first bumps, a second mold layer filling between the second bumps and filling the stepped shape to leave exposed the top portions of the second bumps, and a second semiconductor chip laminated to be electrically connected to the second bumps.

According to an embodiment, there is provided an electronic system including a semiconductor package. The semiconductor package includes a first mold layer including a first portion and a second portion, the first portion covering a first semiconductor chip, the second portion filling between first bumps to expose top portions of the first bumps spaced apart from the first semiconductor chip in a lateral direction, and the first portion and the second portion form a stepped shape, second bumps connected to the exposed first bumps, respectively, and a second mold layer filling between the second bumps and filling the stepped shape to leave exposed the top portions of the second bumps. The second bumps disposed on the first bumps form a through mold connector substantially penetrating the first and second mold layers.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
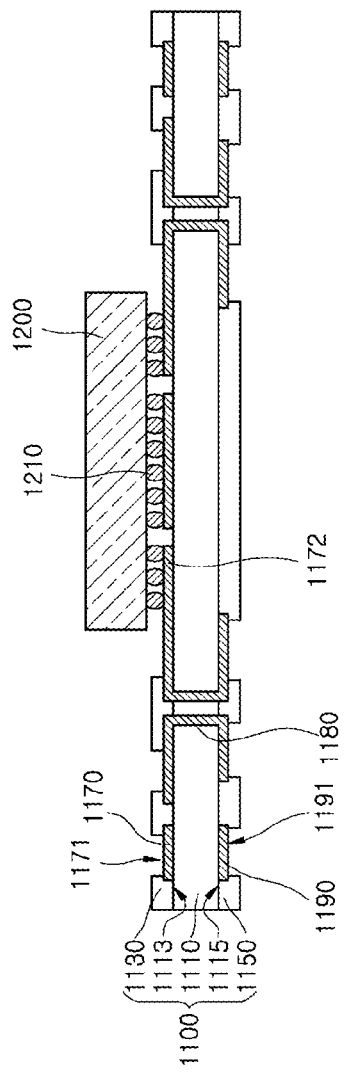
FIGS. 1 to 10 are cross-sectional views illustrating a semiconductor package and a method of manufacturing the same according to an embodiment.

Terms used in description of the embodiments may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

In the following description of the embodiments, it will be understood that terms "first" and "second", "top" and "bottom or lower" are intended to identify the member, but not used to define only the member itself or to mean a particular sequence.

A semiconductor package may include electronic devices such as a semiconductor chip, and the semiconductor chip may include a cut or processed form of a chip from a semiconductor substrate in which electronic circuits are integrated. The semiconductor chip may be a memory chip in which memory integrated circuits such as dynamic random access memory (DRAM) devices, static random access memory (SRAM) devices, flash memory devices, magnetic random access memory (MRAM) devices, resistive random access memory (ReRAM) devices, ferroelectric random access memory (FeRAM) devices or phase changeable random access memory (PcRAM) devices are integrated. Alternatively, the semiconductor chip may be a logic chip, an application specific integrated circuit (ASIC) chip or a system on chip (SoC) in which logic circuits are integrated on a semiconductor substrate. The semiconductor package may be applied to information communication devices such as mobile devices, bio or health care associated electronic devices, and electronic devices wearable on the human body.

The same reference numerals may refer to the same elements throughout the specification. Thus, even though a reference numeral is not mentioned or described with reference to a drawing, the reference numeral may be mentioned or described with reference to another drawing. In addition, even though the reference numerals are not shown in a drawing, it may be mentioned or described with reference to another drawing.

FIGS. 1 to 10 are cross-sectional views illustrating a semiconductor package and a method for manufacturing the same according to an example embodiment.

The semiconductor package of the present disclosure may be exemplified as a package on package (PoP) structure. The PoP structure, for example, may have a structure in which a second semiconductor package portion (top package) is laminated on a first semiconductor package portion (bottom package) and the first and second semiconductor packages are electrically connected to each other by connectors disposed therebetween.

As shown in FIG. 1, a first semiconductor chip 1200 is mounted on a first interconnection structure layer 1100. The first interconnection structure layer 1100 and the first semiconductor chip 1200, for example, may be members constituting the first semiconductor package portion of the PoP structure. The first interconnection structure layer 1100 may be a member providing wiring circuits for electrically connecting the first semiconductor chip 1200 to external devices. The first semiconductor chip 1200 may be electrically or signally connected to the first interconnection structure layer 1100.

The first interconnection structure layer 1100 may include wiring circuits providing electrical paths that the second semiconductor package passes through to be electrically connected to the external devices. The first interconnection structure layer 1100 may include a printed circuit board (PCB) in which wiring circuits are disposed on an insulating substrate. Or, the first interconnection structure layer 1100 may be an interposer in which wiring circuits are disposed on a silicon (Si) substrate or on an organic substrate. Alternatively, the first interconnection structure layer 1100 may be a built up interconnection structure in which wiring circuits are disposed on multi-layered dielectric layers.

The first interconnection structure layer 1100 may include a first dielectric body layer 1110 in the center, and may include a first trace pattern 1170 of a conductive pattern as an interconnection circuit structure on a first surface 1113 of the first dielectric body layer 1110. The first dielectric body layer 1110 may include a layer of a dielectric material such as resin epoxy, or a layer of resin containing glass fabric therein. The first trace pattern 1170 provided on the first surface of the first dielectric body layer 1110 may be provided as a pattern including first contact portions 1171 and second contact portions 1172.

First chip connecting connectors 1210 may contact and may be fixed to the second contact portions 1172 of the first trace pattern 1170, and the first chip connecting connectors 1210 may electrically connect the first interconnection structure layer 1100 to the first semiconductor chip 1200. Each of the first chip connecting connectors 1210 may have a shape of a micro bump directly fixed to the first semiconductor chip 1200. The second contact portions 1172 may include a plurality of independently separated conductive patterns, and each of the conductive patterns is connected to each of the first chip connecting connectors 1210. Accordingly, the second contact portions 1172 may provide paths providing input/output signals to the first semiconductor chip 1200.

A first dielectric layer 1130 may be provided on the first surface 1113 of the first dielectric body layer 1110 of the first interconnection structure layer 1100. The first dielectric layer 1130 may leave exposed the first and second contact portions 1171 and 1172 of the first trace pattern 1170. The first dielectric layer 1130 may include a dielectric layer of a photosensitive organic material such as solder resist.

Second trace patterns 1190 may be provided on a second surface 1115 opposite to the first surface 1113 of the first dielectric body layer 1110 of the first interconnection structure layer 1100. The second trace pattern 1190 may be a conductive pattern providing third contact portions 1191 for electrical connection to external devices.

A second dielectric layer 1150 leaving exposed the third contact portions 1191 of the second trace pattern 1190 may be provided on the second surface 1115 of the first dielectric body layer 1110 of the first interconnection structure layer 1100. Conductive first inner trace patterns 1180 for electrically connecting the first trace pattern 1170 to the second trace pattern 1190 may be provided in the first dielectric body layer 1110. Each of the conductive first inner trace patterns 1180 may have a shape of a conductive via substantially penetrating the first dielectric body layer 1110.

The first semiconductor chip 1200 may include integrated circuits disposed on a semiconductor substrate, for example, a silicon substrate, and may include an interconnection structure connected to the integrated circuits. Transistors for constituting the integrated circuits may be provided on the silicon substrate, and interlayer dielectric (ILD) layers, inter-metal dielectric (IMD) layers and metal interconnections may be provided on the silicon substrate, and the transistors at least may form substantial part of the first semiconductor chip 1200. The first semiconductor chip 1200 may be designed to perform functions of a controller chip or a logic chip. The first semiconductor chip 1200 may have a shape of a system on chip (SoC).

Figure 2:
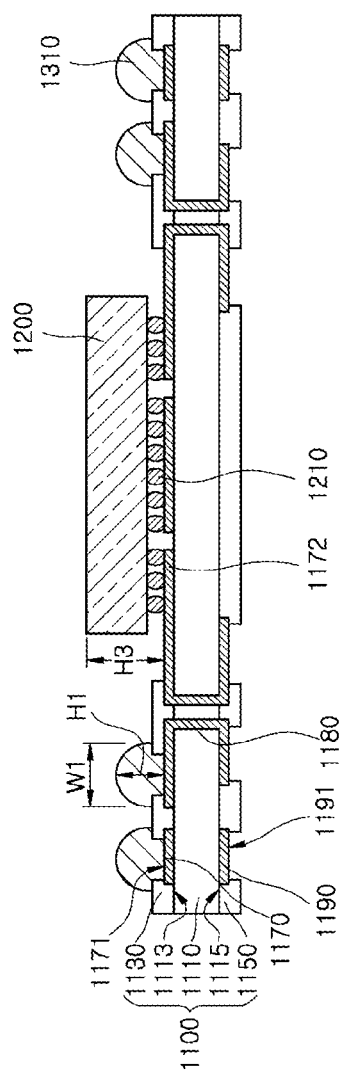

As shown in FIG. 2, a plurality of first bumps 1310 are mounted on the first interconnection structure layer 1100 spaced apart from the first semiconductor chip 1200 in a lateral direction. The first semiconductor chip 1200 may be disposed on the first interconnection layer 1100. Each of the first bumps 1310 may have a ball shape such as a solder ball shape. The first bumps 1310 may be attached to the first contact portions 1171 of the first trace pattern 1170. Bottom portion of each of the first bumps 1310 may contact the first contact portion 1171 of the first trace pattern 1170, and the first bumps 1310 may be fixed to the first contact portions 1171 of the first trace pattern 1170.

A plurality of the first bumps 1310 may be disposed on the first interconnection structure layer 1100 except in a region overlapped with the first semiconductor chip 1200. The number of the first bumps 1310 capable of being disposed on the first interconnection structure layer 1100 may depend on an area of the first interconnection structure layer 1100 left exposed by the first semiconductor chip 1200, on an arrangement pitch between each of the first bumps 1310, and on a diameter W1 of the first bump 1310. The area of the exposed region of the first interconnection structure layer 1100 may be limited by a size of the entire semiconductor package, and may be limited by a size of the first semiconductor chip 1200.

In order to satisfy a high-speed operation and a variety of functions of the semiconductor package, the number of I/O paths required in the semiconductor package is greatly increased. Since the first bumps 1310 are disposed to provide the I/O paths, the arrangement pitch of the first bumps 1310 can be reduced by reducing the diameter W1 of the first bump 1310 to dispose more first bumps 1310 in a limited area of the first interconnection structure layer 1100. When the diameter W1 of the first bump 1310 is reduced, a height H1 of the first bump 1310 may also be lowered. The height H1 of the first bump 1310 having the solder ball shape may be limited depending on the diameter W1 of the first bump 1310. When the diameter W1 of the first bump 1310 is reduced, the height H1 of the first bump 1310 may also be lowered. Accordingly, the height H1 of the first bump 1310 may be lower than an arrangement height H3 of the first semiconductor chip 1200. In order to dispose more I/O paths, a greater number of small balls are disposed with a small pitch. Accordingly, the height of the ball becomes lower than the arrangement height of the chip.

Figure 3:
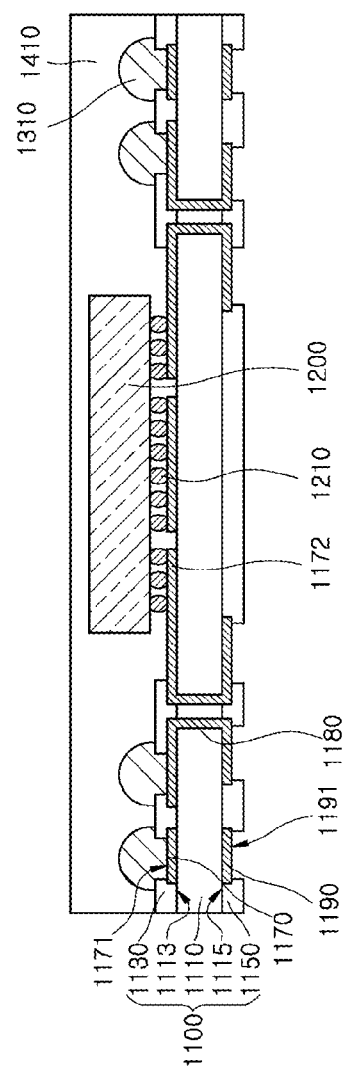

As shown in FIG. 3, a first mold layer 1410 is formed to cover the first semiconductor chip 1200 and a plurality of the first bumps 1310. The first mold layer 1410 may be formed by a molding process using an epoxy molding compound (EMC). The first mold layer 1410 may be provided as an encapsulant to protect the first semiconductor chip 1200.

Figure 4:
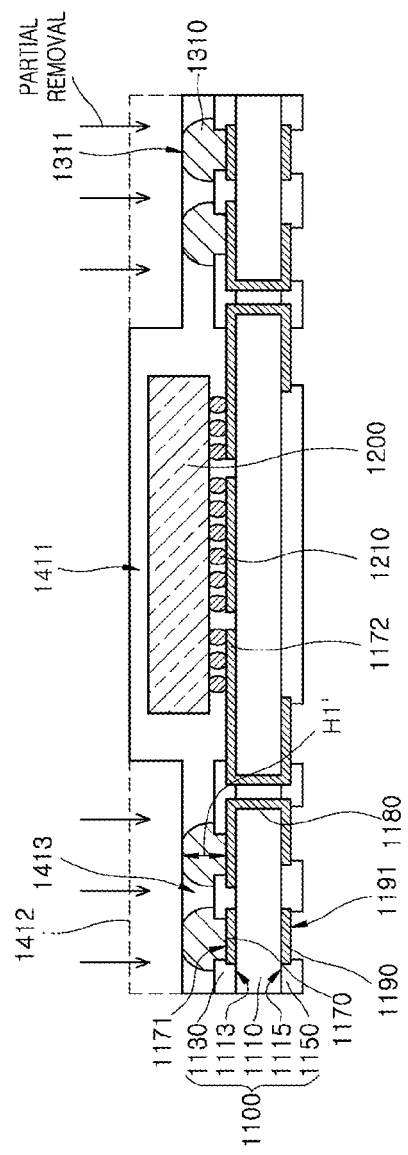

As shown in FIG. 4, some portions of the first mold layer (1410 of FIG. 3) may be selectively removed. A first portion 1411 of the first mold layer which covers the first semiconductor chip 1200 is not removed. A second portion 1412, excluding the first portion 1411, of the first mold layer may be removed so that the second portion 1412 has a predetermined thickness. The second portion 1412 of the mold layer may be a portion in which the first bumps 1310 are disposed. In the process of partial removal of the second portion 1412 of the first mold layer, a surface of a top portion 1311 of the first bump 1310 may be exposed. When partially removing the second portion 1412 of the first mold layer, the top portion 1311 of the first bump 1310 may be removed by a predetermined thickness. Accordingly, the first bump 1310 may have a lowered height H1' than an initial height (H1 of FIG. 2).

As the partial removal is performed with respect to the second portion 1412 of the first mold layer, the second portion 1412 of the first mold layer is recessed from the surface, and the partial removal may be stopped after exposing the top portion 1311 of the first bump 1310. After a predetermined thickness of the second portion 1412 of the first mold layer is removed, a remaining portion 1413 of the second portion 1412 may have a lower surface height than the surface height of the first portion 1411 of the first mold layer. Accordingly, there may be a step shape between the remaining portion 1413 of the second portion of the first mold layer and the first portion 1411 of the first mold layer. The remaining portion 1413 of the second portion of the first mold layer may leave exposed the top portions 1311 of the first bumps 1310, and may separate the first bumps 1310 from each other by filling a space between each of the first bumps 1310.

The second portion 1412 of the first mold layer may be selectively removed by introducing a grinder (not illustrated) over only the second portion 1412 of the first mold layer and partially grinding the second portion 1412 of the first mold layer. The second portion 1412 of the first mold layer may be partially removed by grinding so that a plurality of the first bumps 1310 are exposed at the same time. Through grinding, a top portion of the first bump 1310 may be removed by a predetermined thickness. In the case of forming opening holes (not illustrated) that individually expose each the first bumps 1310, a long process time may be required because each of the opening holes has to be formed sequentially. On the contrary, in the case of removing a certain thickness of the second portion 1412 by partial grinding, the removing process may be performed in a shorter process time because a plurality of the first bumps 1310 are exposed at the same time.

Figure 5:
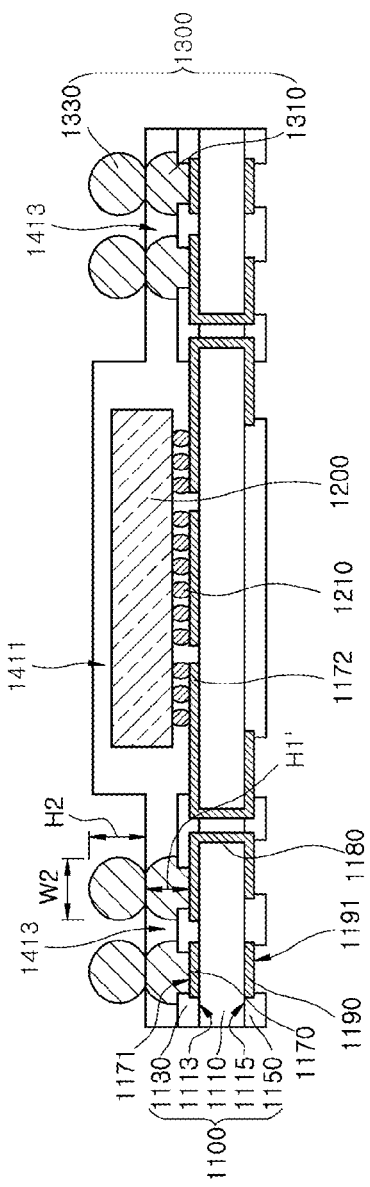

As shown in FIG. 5, second bumps 1330 connected to the exposed first bumps 1310 are disposed. Each of the second bumps 1330 may have a ball shape. The second bump 1330 may have a shape of a solder ball having a diameter W2 and a height H2 substantially equal to those of the first bump 1310. The second bumps 1330 may be attached to the first bumps 1310 to be overlapped with the first bumps 1310 and may be fixed to the first bumps 1310. The sum of a height H1' of the attached first bump 1310 and a height H2 of the second bump 1330, that is, the total height of the laminated first bump 1310 and second bump 1330, may be higher than the height (H3 of FIG. 2) of the first semiconductor chip 1200. The total height of the sequentially laminated first bump 1310 and second bump 1330 is higher than the surface height of the first portion 1411 of the first mold layer. Accordingly, a part of the top portion of the second bump 1330 protrude above the first portion 1411 of the first mold layer.

When a part of the top portion of the solder ball protrudes above the surface of the first portion 1411 of the first mold layer having only one solder ball, the solder ball may be required to have a fairly large diameter because the height of the solder ball depends on the diameter of the solder ball. In this way, if the solder balls having a large diameter are disposed in a limited area of the first interconnection structure layer 1100, it may be difficult to secure more I/O paths because the number of the solder balls that can be disposed in the limited area can be limited.

Meanwhile, the semiconductor package may be required to have a very large design size, because the first interconnection structure layer 1100 has to secure larger area in order to dispose a greater number of solder balls to secure a greater number of I/O paths. It is possible to implement the total height of the structure such that the second bump 1330 may be laminated on the first bump 1310 to a required height level and to maintain a small diameter of the solder ball making up the first bump 1310 and second bump 1330. Accordingly, it is possible to dispose more laminated structures of the first bump 1310 and second bump 1330 in the limited area of the first interconnection structure layer 1100.

When implementing the height (H1 of FIG. 2) of the first bump 1310 to a level over the arrangement height (H3 of FIG. 2) of the first semiconductor chip 1200 with only one first bump 1310, the diameter (W1 of FIG. 2) of the first bump 1310 may have to be relatively increased. As such, when the diameter (W1 of FIG. 2) of the first bumps 1310 is increased, a smaller number of the first bumps 1310 can be disposed on the first interconnection structure layer 1100. In order to dispose a greater number of the first bumps 1310, the first bumps 1310 may be formed to have a relatively smaller diameter. A connector 1300 having the required height H1'+H2 can be implemented by laminating the second bump 1330 on the first bump 1310.

Figure 6:
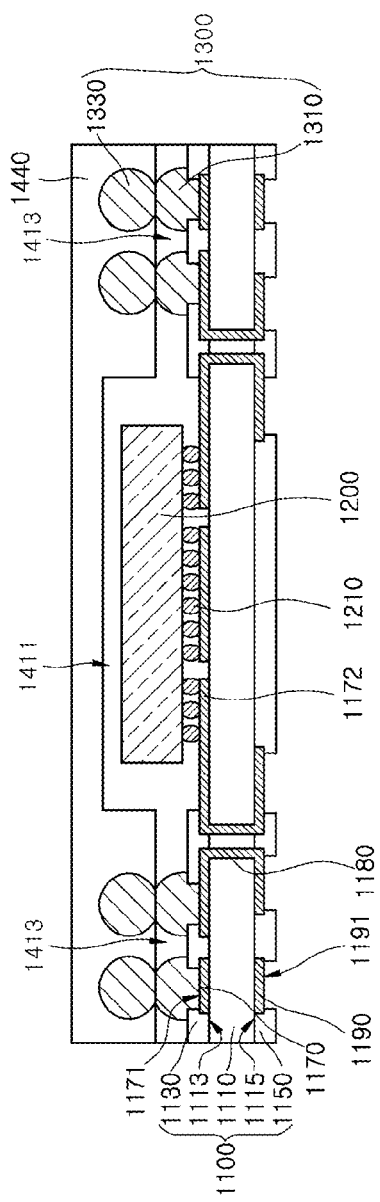

As shown in FIG. 6, a second mold layer 1440 is formed to cover the second bumps 1330 and to isolate the second bumps 1330 from each other. The second mold layer 1440 may be formed by a molding process using EMC. The second mold layer 1440 may be formed to fill the removed portion of the second portion (1412 in FIG. 4) of the first mold layer. The second mold layer 1440 may be formed to compensate for a step-shaped topology provided by the partially removed second portion (1412 in FIG. 4) of the first mold layer and to have a flat outer surface.

Figure 7:
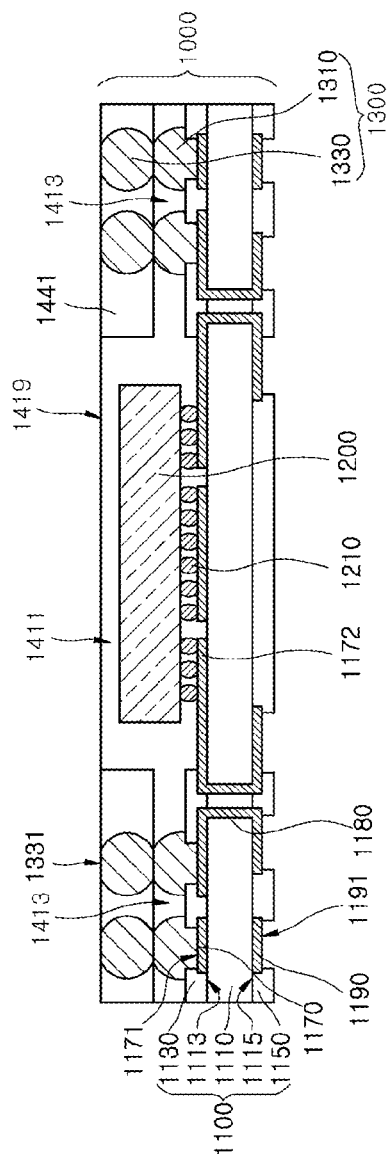

As shown in FIG. 7, the second mold layer (1440 in FIG. 6) may be recessed to expose a surface 1419 of the first portion 1411 of the first mold layer. A flattened second mold layer 1441 may remain to fill the step shape. The process of flattening the second mold layer (1440 in FIG. 6) may be performed by grinding the entire surface of the second mold layer (1440 in FIG. 6) so that the surface is recessed to a predetermined thickness. Through grinding, a top portion of the second bump 1330 may be recessed a predetermined thickness and a top portion 1331 of the second bump 1330 may be exposed.

The second bump 1330 laminated on the first bump 1310 may form a through mold connector (TMC) 1300 structure that substantially penetrates the second portion 1413 of the first mold layer and the recessed second mold layer 1441. In order to increase the height of the TMC 1300, additional bumps (not illustrated) may further be provided between the first bump 1310 and the second bump 1330. The additional bumps (not illustrated) may be formed to have the same shape as the first bump 1310. Also, an additional mold layer (not illustrated) may be formed to fill between the additional bumps, and the additional mold layer may be partially removed to expose top portions of the additional bumps (not illustrated). Then, the second bumps 1330 may be formed on exposed top portions of the additional bumps (not illustrated). Accordingly, it is possible to increase a height of the TMC 1300 or to introduce the first bump 1310 or second bump 1330 in a ball shape having a smaller diameter.

A first semiconductor package portion 1000 structure is formed to include the first interconnection structure layer 1100, the first semiconductor chip 1200 and the TMC 1300. The TMC 1300 may substantially penetrate the multi-layered mold layer structure so that the second portion 1413 of the first mold layer and the second mold layer 1441 are laminated. Although the first semiconductor package portion 1000 is exemplified such that the first interconnection structure layer 1100 is connected to the first bump 1310, the structure may be modified so that the first interconnection structure layer 1100 is connected to the second bump 1330. Also, although the first semiconductor package portion 1000 is exemplified such that the first interconnection structure layer 1100 is connected to the first bump 1310, the structure may be modified so that an additional semiconductor chip (not illustrated) is connected to the first bump 1310 or an additional semiconductor chip (not illustrated) is connected to the first chip connecting connector 1210. Although the first semiconductor package portion 1000 is exemplified to include only one first semiconductor chip 1200, the structure may be modified so that a plurality of the first semiconductor chips 1200 are laminated. Although the first semiconductor package portion 1000 is exemplified so that the first semiconductor chip 1200 is connected to the first interconnection structure layer 1100 through the first chip connecting connectors 1210 of a micro bump shape, the first chip connecting connector 1210 may have a bonding wire shape.

Figure 8:
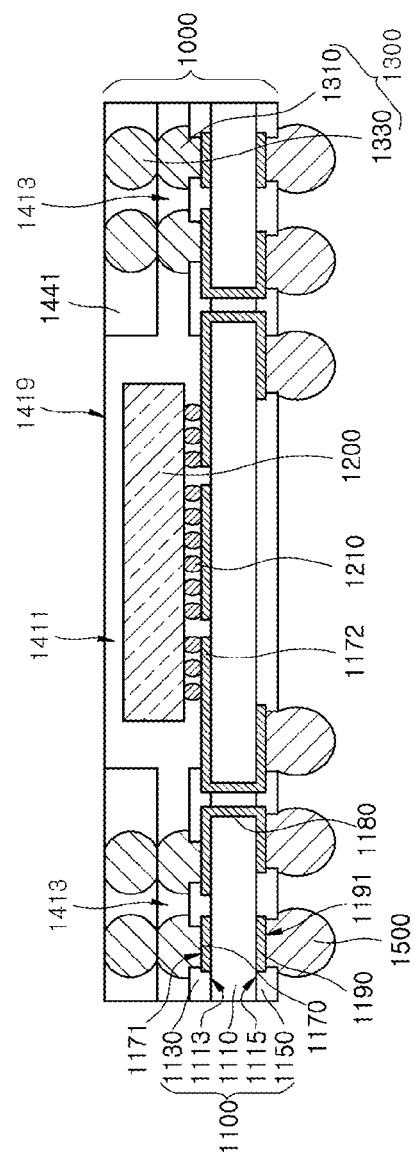

As shown in FIG. 8, outer connectors 1500 for electrical connection to external devices may be attached on the second surface 1115 of the first dielectric body layer 1110 of the first interconnection structure layer 1100. Each of the outer connectors 1500 may have a solder ball shape. The outer connectors 1500 may be attached to the third contact portions 1191 of the second trace pattern 1190.

Figure 9:
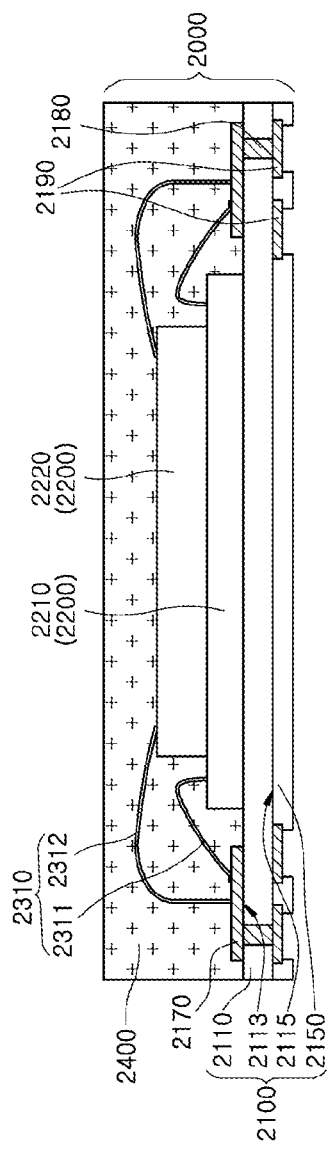

As shown in FIG. 9, a second semiconductor package portion 2000 may be formed. The second semiconductor package portion 2000 may be formed as a package to be laminated on the first semiconductor package portion (1000 in FIG. 7). The second semiconductor package portion 2000 may have a structure that a second semiconductor chip 2200 is mounted on a second interconnection structure layer 2100. The second interconnection structure layer 2100 may be a member providing interconnection circuits for electrically connecting the second semiconductor chip 2200 to the first semiconductor package portion (1000 in FIG. 7) or to external devices. The semiconductor chip 2200 may be electrically or signally connected to the second interconnection structure layer 2100. The second interconnection structure layer 2100 may be a type of PCB that includes wiring circuits disposed on an insulating substrate. The second interconnection structure layer 2100 may be an interposer in which the wiring circuits are disposed on a silicon substrate or on an organic substrate. Alternatively, the second interconnection structure layer 2100 may be a built up interconnection structure including wiring circuits disposed on multi-layered dielectric layers.

The second interconnection structure layer 2100 may include a second dielectric body layer 2110 in the center, and the second interconnection structure layer 2100 may include third trace patterns 2170 of conductive patterns on a third surface 2113 of the second dielectric body layer 2110 as a wiring circuit structure. The second dielectric body layer 2110 may include a layer of a dielectric material such as epoxy resin or a layer of resin containing glass fabric. Second chip connecting connectors 2310 may be fixed to the third trace patterns 2170 disposed on the third surface 2113 of the second dielectric body layer 2110, and the second chip connecting connectors 2310 may electrically connect the second interconnection structure layer 2100 to the second semiconductor chip 2200.

The second semiconductor chip 2200 may be disposed to form a multi-layered structure. In an embodiment, an upper second semiconductor chip 2220 may be laminated on a lower second semiconductor chip 2210 as a third semiconductor chip, or a greater number of the third semiconductor chips may further be laminated on the lower second semiconductor chip 2210. The second chip connecting connector 2310 may include a second chip connecting first connector 2311 directly connecting the lower second semiconductor chip 2210 to the third trace pattern 2170, and a second chip connecting second connector 2312 directly connecting the upper second semiconductor chip 2220 to the third trace pattern 2170. The second chip connecting connector 2310 may have a bonding wire shape. Although not illustrated, the second chip connecting connector 2310 may also be provided in a bump connecting structure.

Fourth trace patterns 2190 may be disposed on a fourth surface 2115 opposite the third surface 2113 of the second dielectric body layer 2110 of the second interconnection structure layer 2100. A portion of a surface of each of the fourth trace patterns 2190 may remain exposed by a third dielectric layer 2150 to provide an electrical connection to the first semiconductor package portion (1000 in FIG. 7) or to external devices. Conductive second inner trace patterns 2180 for electrically connecting the third trace pattern 2170 to the fourth trace pattern 2190 may be disposed in the second dielectric body layer 2110. The conductive second inner trace pattern 2180 may have a shape of a conductive via that substantially penetrates the second dielectric body layer 2110.

The second semiconductor package portion 2000 may be formed by disposing the second semiconductor chip 2200 on the second interconnection structure layer 2100 and forming a third mold layer 2400 to cover the second semiconductor chip 2200.

Figure 10:
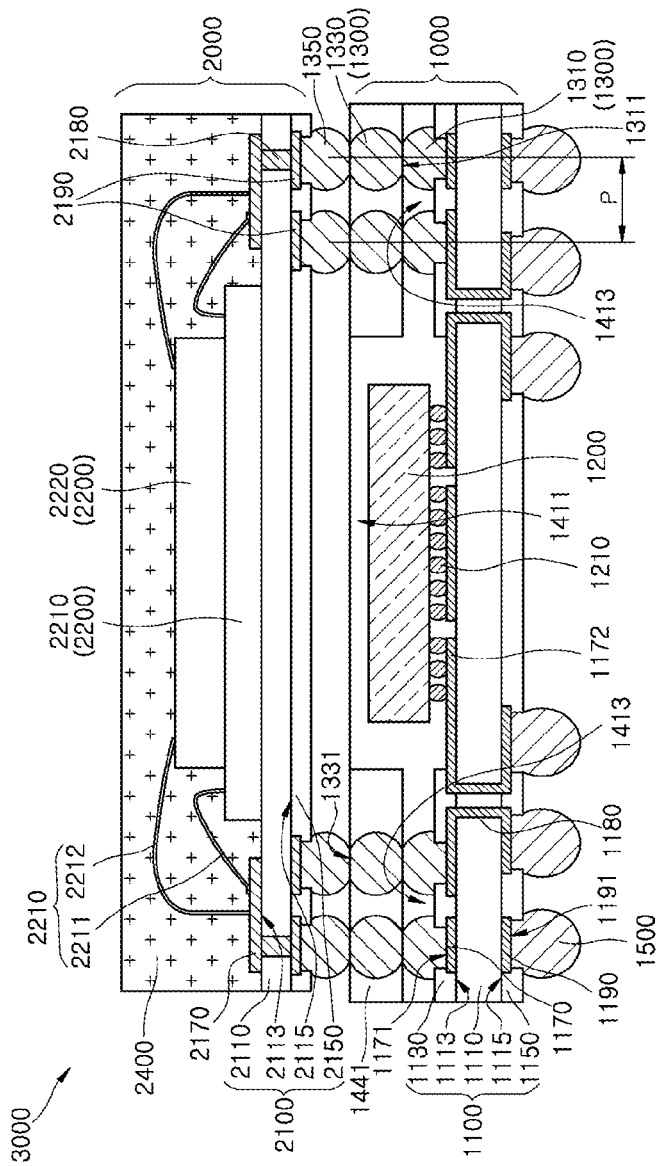

As shown in FIG. 10, the second interconnection structure layer 2100 of the second semiconductor package portion 2000 may be electrically and mechanically connected to the second bumps 1330 of the first semiconductor package portion 1000 using third bumps 1350. The third bumps 1350 may be fixed to exposed top portions of the second bumps 1330. Accordingly, it is possible to have a semiconductor package 3000 including a PoP structure that the second semiconductor package portion 2000 is laminated to the first semiconductor package portion 1000. Each of the third bumps 1350 may have a solder ball shape. The third bump 1350 may have the substantially same ball shape as the first bump 1310 or the second bump 1330, or may have a solder ball shape having the same diameter as the first bump 1310 or the second bump 1330.

Since the second bump 1330 forming the TMC 1300 can have a small diameter and can be disposed in a greater number, the second semiconductor chip 2200 can be disposed directly and electrically connected to the second bumps 1330. In addition, in FIG. 10, though the structure is exemplified with the second semiconductor package portion 2000 laminated and electrically connected to the second bumps 1330, the structure can be modified so that the second semiconductor package portion 2000 is disposed at a position of the first interconnection structure layer 1100, and the first interconnection structure layer 1100 is disposed to be connected to the second bumps 1330.

Referring to FIG. 10 again, the semiconductor package 3000 may include the first semiconductor chip 1200 and a plurality of the first bumps 1310 that are disposed on the first interconnection structure layer 1100, and may include the first mold layer 1411 and 1413. The first mold layer 1411 and 1413 may include the first portion 1411 covering the first semiconductor chip 1200 and the second portion 1413 filling between each the first bumps 1310 to leave exposed the top portions 1311 of the first bumps 1310. The first portion 1411 and the second portion 1413 may form a stepped shape. The semiconductor package 3000 may include the second bumps 1330 connected to the exposed first bumps 1310, and a second mold layer 1441 filling between each of the second bumps 1330 to leave exposed the top portions 1331 of the second bumps 1330 and filling the stepped shape. The semiconductor package 3000 may include the second semiconductor chip 2200 laminated to be electrically connected to the second bumps 1330.

The TMC 1300 including the second bump 1330 laminated on the first bump 1310 may be provided in the semiconductor package 3000 to substantially penetrate the multi-layered mold layer structure 1413 and 1441. The first bump 1310 and the second bump 1330 can be provided with solder balls having a small diameter, thus the TMC 1300 may be provided in the semiconductor package 3000 with a smaller pitch interval P. The TMC 1300 structure may be formed by laminating solder ball shapes unlike a known through mold via (TMV) structure. Since the known TMV structure is formed by forming via holes (not illustrated) which penetrate a mold layer using laser drilling, a long process time may be taken to form a large number of the TMVs to have a fine diameter. Since the TMCs 1300 can be formed by attaching a large number of solder balls and partial removing the mold layer, the TMCs 1300 can be constructed within a relatively short process time.

Figure 11:
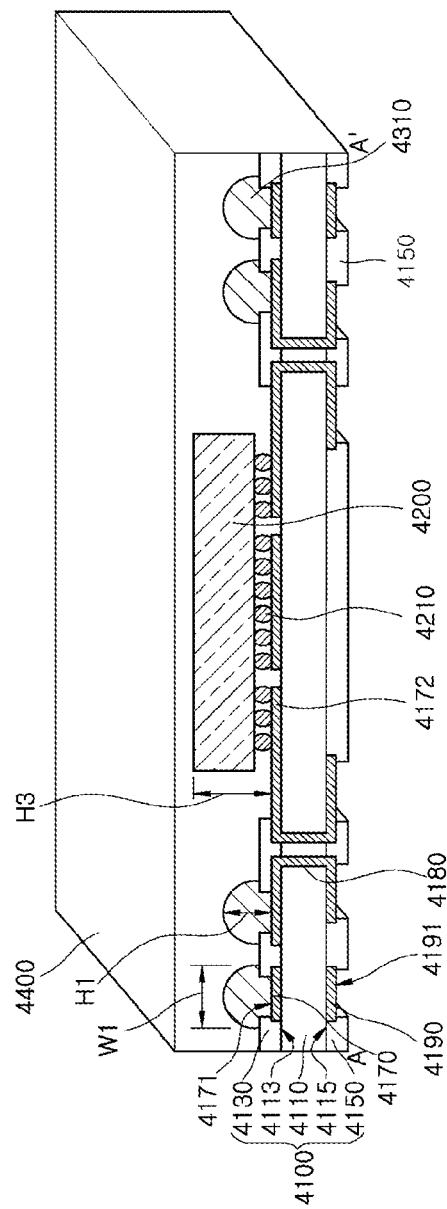
FIGS. 11 to 18 are schematic views illustrating a semiconductor package and a method of manufacturing the same according to an embodiment.
Figure 12:
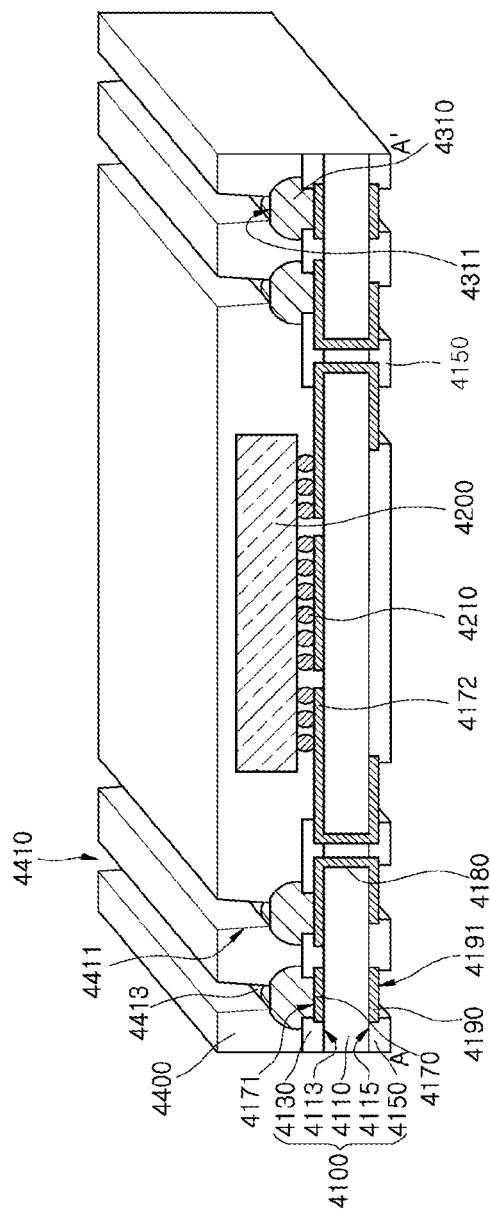
Figure 13:
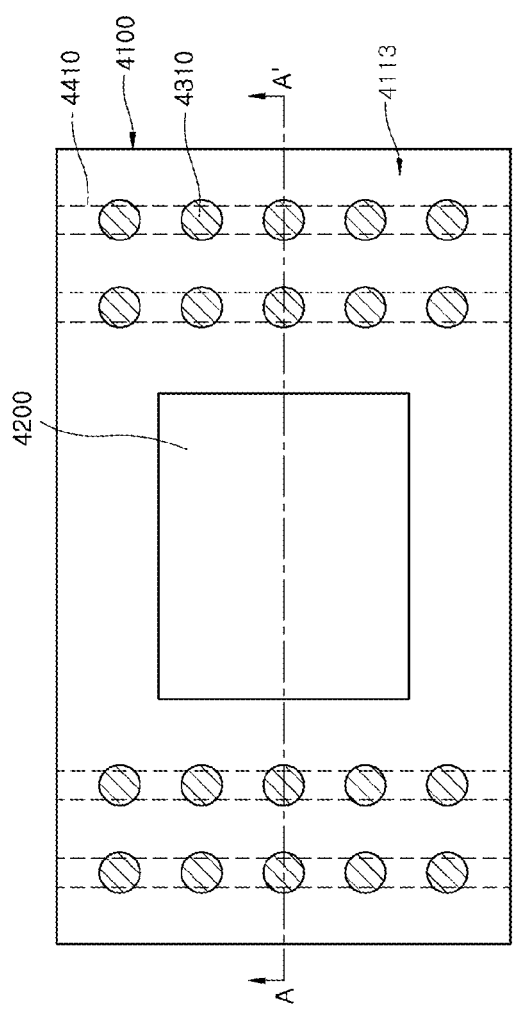
Figure 14:
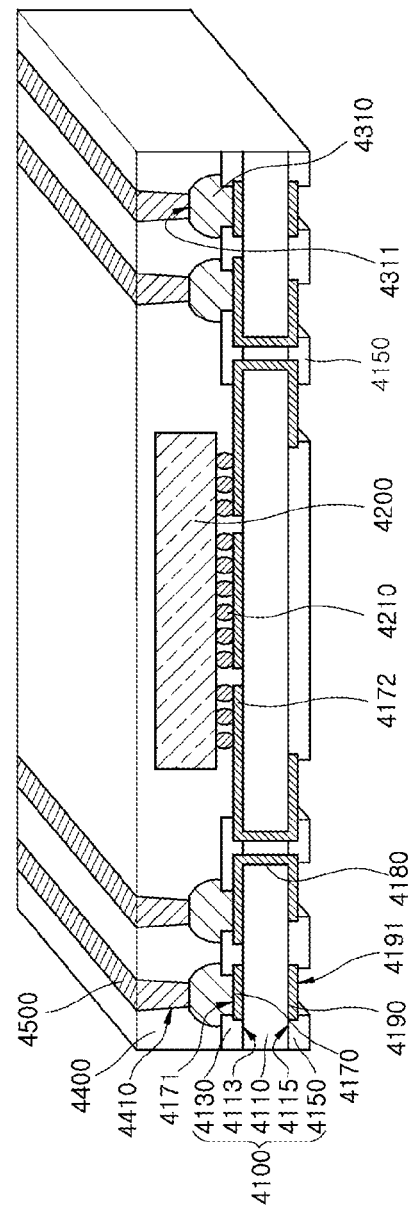
Figure 15:
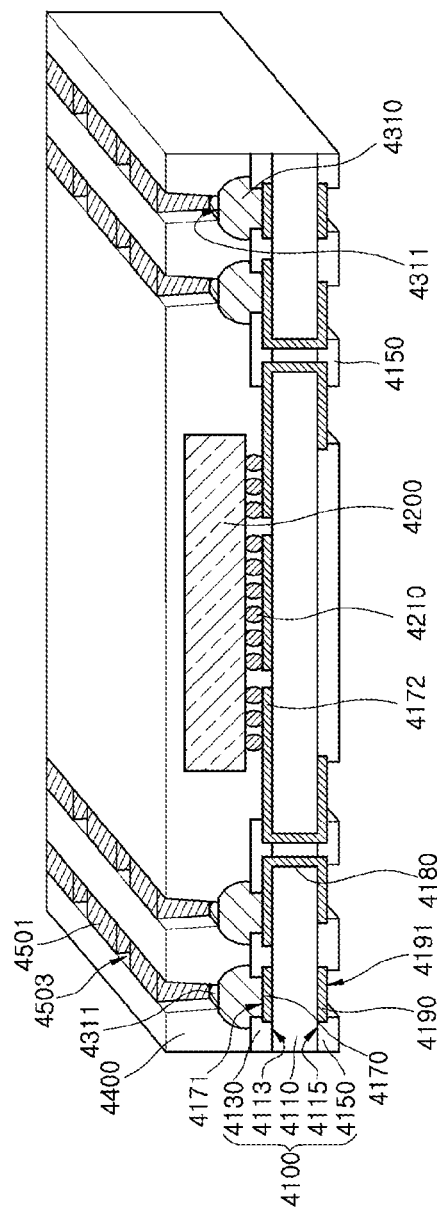
Figure 16:
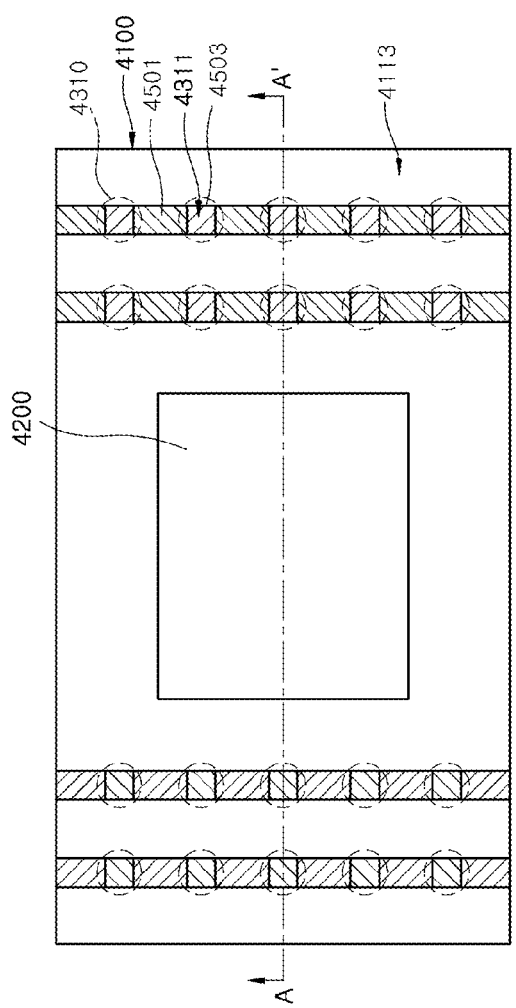
Figure 17:
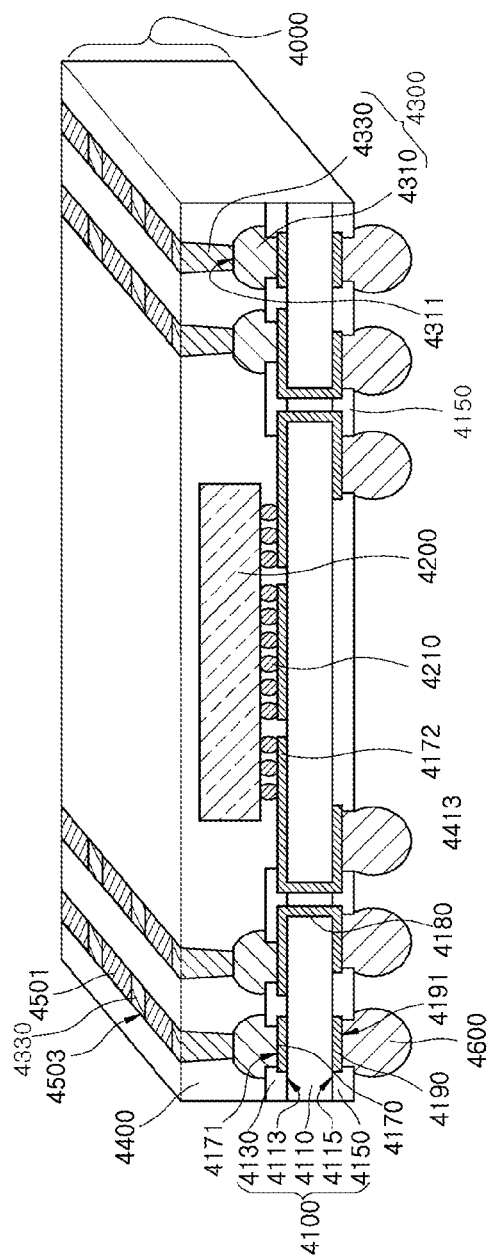

FIGS. 11 to 18 are views illustrating a semiconductor package and a method for manufacturing the same according to an embodiment. FIGS. 11, 12 and 14 are cross-sectional perspective views showing cross-sectional structures taken along a line A-A' of a top plan view in FIG. 13. FIGS. 15 and 17 are cross-sectional perspective views showing the sections taken along the line A-A' of a top plan view in FIG. 16.

As shown in FIG. 11, a first semiconductor chip 4200 is mounted on a first interconnection structure layer 4100. The first interconnection structure layer 4100 may be a member providing wiring circuits for electrically connecting the first semiconductor chip 4200 to external devices, and may have a shape of a PCB or an interposer in which wiring circuits are disposed on a silicon (Si) substrate or an organic substrate. Alternatively, the first interconnection structure layer 4100 may be a built up interconnection structure in which wiring circuits are disposed on a structure of multi-layered dielectric layers.

The first interconnection structure layer 4100 may include a first dielectric body layer 4110 in the center, and the first interconnection structure layer 4100 may include a first trace pattern 4170 of a conductive pattern as an interconnection circuit structure on a first surface 4113 of the first dielectric body layer 4110. The first trace pattern 4170 provided on the first surface 4113 of the first dielectric body layer 41110 may be provided to include first contact portions 4171 and second contact portions 4172. First chip connecting connectors 4210 may contact and be fixed to the second contact portions 4172 of the first trace pattern 4170, and the first chip connecting connectors 4210 may electrically connect the first interconnection structure layer 4100 to the first semiconductor chip 4200. Each of the first chip connecting connectors 4210 may have a shape of a micro bump directly fixed to the first semiconductor chip 4200. The second contact portion 4172 may include a plurality of separated conductive patterns, and each of the conductive patterns is connected to each of the first chip connecting connectors 4210. Accordingly, the second contact portion 4172 may provide paths that provide input/output (I/O) signals to the first semiconductor chip 4200.

A first dielectric layer 4130 may be provided on the first surface 4113 of the first dielectric body layer 4110. The first dielectric layer 4130 may leave exposed the first and second contact portions 4171 and 4172 of the first trace pattern 4170. The first dielectric layer 4130 may include a dielectric layer of a photosensitive organic material such as solder resist.

Second trace patterns 4190 may be provided on a second surface 4115 opposite to the first surface 4113 of the first dielectric body layer 4110 of the first interconnection structure layer 4100. The second trace patterns 4190 may be conductive patterns providing third contact portions 4191 for electrical connection to external devices. A second dielectric layer 4150 leaving exposed the third contact portions 4191 of the second trace patterns 4190 may be provided on the first surface 4113 of the first dielectric body layer 4110 of the first interconnection structure layer 4100. Conductive first inner trace patterns 4180 for electrically connecting the first trace pattern 4170 to the second trace pattern 4190 may be provided in the first dielectric body layer 4110. The conductive first inner trace pattern 4180 may have a shape of a conductive via substantially penetrating the first dielectric body layer 4110.

The first semiconductor chip 4200 may include integrated circuits disposed on a semiconductor substrate, for example, a silicon substrate, and may include an interconnection structure connected to the integrated circuits. Transistor devices for constituting the integrated circuits may be provided on the silicon substrate, and interlayer dielectric (ILD) layers, inter-metal dielectric (IMD) layers, and metal interconnections may be provided on the silicon substrate, and thus the transistor devices may form the first semiconductor chip 4200. The first semiconductor chip 4200 may be designed to perform functions of a controller chip or a logic chip. The first semiconductor chip 4200 may have a shape of a system on chip (SoC).

A plurality of first bumps 4310 are mounted on the first interconnection structure layer 4100 to be spaced apart from the first semiconductor chip 4200 in a lateral direction. Each of the first bumps 4310 may have a ball shape such as a solder ball shape. The first bumps 4310 may be attached to the first contact portions 4171 of the first trace pattern 4170. A bottom end of each of the first bump 4310 may contact the first contact portion 4171 of the first trace pattern 4170, and the first bumps 4310 may be fixed to the first trace pattern 4170.

A plurality of the first bumps 4310 may be disposed on the first interconnection structure layer 4100 except not in a region overlapped with the first semiconductor chip 4200. The number of the first bumps 4310 capable of being disposed on the first interconnection structure layer 4100 may depend on an area of a region of the first interconnection structure layer 4100 which remains exposed by the first semiconductor chip 4200, and on an arrangement pitch between the first bumps 4310, and on a diameter W1 of the first bump 4310. The area of the region of the first interconnection structure layer 4100 which is exposed by the first semiconductor chip 4200 may be limited by a size of the whole semiconductor package, and may be limited by a size of the first semiconductor chip 4200.

In order to satisfy a high-speed operation and a variety of functions of the semiconductor package, the number of I/O paths required in the semiconductor package has been severely increased. Since the first bumps 4310 are disposed to provide the I/O paths, the arrangement pitch of the first bumps 4310 may be reduced by reducing the diameter W1 of the first bumps 4310 in order to dispose a larger number of the first bumps 4310 in a limited area of the first interconnection structure layer 4100. When the diameter W1 of the first bump 4310 is reduced, a height H1 of the first bump 4310 may also be lowered. The height H1 of the first bump 4310 having the solder ball shape may be limited depending on the diameter W1 of the first bump 4310. When the diameter W1 of the first bump 4310 is small, the height H1 of the first bump 4310 can also be lowered. Accordingly, the height H1 of the first bump 4310 may be lower than an arrangement height H3 of the first semiconductor chip 4200. In order to dispose more I/O paths, small balls may be disposed with a small pitch in a great number. Accordingly, the height of the ball becomes lower than the arrangement height of the chip.

A first mold layer 4400 is formed to cover the first semiconductor chip 4200 and a plurality of the first bumps 4310. The first mold layer 4400 may be formed by a molding process using an epoxy molding compound (EMC). The first mold layer 4400 may be provided as an encapsulant to protect the first semiconductor chip 4200.

As shown in FIGS. 12 and 13, trenches 4410 are formed in the first mold layer 4400. FIG. 12 shows a cross-sectional shape taken along a line A-A' of a planar arrangement shape shown in FIG. 13. The trenches 4410 may be formed to expose a surface of a top portion 4311 of the first bump 4310 by partially removing some parts of the first mold layer 4400. A plurality of the first bumps 4310 may be disposed to form arrays at a position spaced apart from the first semiconductor chip 4200 in a lateral direction, as shown in FIG. 13. The first bumps 4310 may be disposed to form columns with each other in a direction perpendicular to the A-A' line. The columns of the first bumps 4310 may be disposed in a plurality. The trenches 4410, for example, may be located at a region of the first mold layer 4400 that includes a plurality of the first bumps 4310 forming a column. A portion of the first mold layer 4400, for example, may be set to a band shape elongated in a perpendicular direction to the A-A' line, and the set portion can be partially removed to form the trenches 4410 which expose a plurality of the first bumps 4310. Side surfaces 4411 of the trenches 4410 may be formed by the first mold layer 4400 and surfaces of the top portions 4311 of the first bumps 4310 may be exposed at the bottoms of the trenches 4410. The bottom portion 4413 of the trench 4410 which spaces each of the first bumps 4310 may be formed by the first mold layer 4400.

When forming the trenches 4410 by selectively removing the first mold layer 4400 of a certain thickness, some thickness of the top portion 4311 of the first bumps 4310 may be removed in the removal process. The first mold layer 4400 may be recessed from the top surface, and a surface of the top portion 4311 of the first bump 4310 may be exposed. The process to form the trenches 4410 may be performed by selectively and partially sawing a portion of the first mold layer 4400 using a saw blade (not illustrated). A blade having a width substantially equal to the width of the trench 4410 may be used as the saw blade (not illustrated). Since the trenches 4410 are formed by the sawing process, a plurality of the first bumps 4310 can be exposed in the trenches 4410 at the same time. Accordingly, a plurality of the first bumps 4310 can be exposed within a shorter process time.

As shown in FIG. 14, filling dielectric layers 4500 are formed to fill the trenches 4410. The filling dielectric layer 4500 may include a polymer component coated to fill the trench 4410. The filling dielectric layer 4500 may include a layer of a polymer material containing a photosensitive component or a layer of an organic material containing a photosensitive component. For example, the filling dielectric layers 4500 may be formed by coating a photosensitive polyimide to fill the trenches 4410. Alternatively, a photo resistive material may be coated to fill the trenches 4410.

As shown in FIGS. 15 and 16, a portion of the filling dielectric layer (4500 of FIG. 14) is selectively removed to form opening holes 4503 which expose the top portions 4311 of the first bumps 4310. The opening holes 4503 may be formed to be spaced apart from each other in the trenches 4410 along the elongated direction of the trenches 4410. A remaining portion 4501 of the filling dielectric layer may remain to isolate each of the opening holes 4503. The opening holes 4503 which substantially penetrate the filling dielectric layer 4500 may be formed using a photolithography process. The opening holes 4503 may be formed by exposing and developing a predetermined region of the filling dielectric layer 4500. Since the filling dielectric layer 4500 is formed to contain a photosensitive material layer, for example, a photosensitive polyimide layer, the exposure and development process may be directly performed to the filling dielectric layer 4500. Accordingly, additional processes for forming a dry film and masking can be omitted.

As shown in FIG. 17, conductive vias 4330 are formed to be connected to each of the first bumps 4310 exposed by the opening holes 4503. A conductive layer may be formed to fill the opening holes 4503 and the individual conductive via 4330 may be separated from the conductive layer. Since the conductive via 4330 overlaps the first bump 4310, a height of the conductive via 4330 may be lower than the height (H3 of FIG. 11) of the first semiconductor chip 4200. The height of the conductive via 4330 may be lower than the thickness of the first mold layer 4400. Since the height of the conductive via 4330 can be lowered, aspect ratio of the opening hole 4503 can be reduced. Accordingly, it is possible to prevent defects because the opening holes 4503 are not filled with the conductive vias 4330. Accordingly, a diameter of the conductive via 4330 can be reduced to have a smaller size. Thus, the TMC 4300 structure formed with the conductive vias 4330 laminated on the first bumps 4310 can have a smaller diameter and a smaller pitch.

The first interconnection structure layer 4100, the first semiconductor chip 4200, the mold layer structure formed by the first mold layer 4400 and filling dielectric layer 4501 and through mold connectors (TMCs) 4300 that substantially penetrate the mold layer structure form a first semiconductor package portion 4000. Although the first semiconductor package portion 4000 exemplified that the first interconnection structure layer 4100 is connected to the first bumps 4310, the structure of the first semiconductor package portion 4000 may be modified so that the first interconnection structure layer 4100 is connected to the conductive vias 4330. Although the first semiconductor package portion 4000 exemplifies that the first interconnection structure layer 4100 is connected to the first bumps 4310, the structure of the first semiconductor package portion 4000 can be modified so that an additional semiconductor chip (not illustrated) is connected to the first bumps 4310 or an additional semiconductor chip (not illustrated) is connected to the first chip connecting connector 4210.

As shown in FIG. 17, outer connectors 4600 for electrical connection to external devices may be attached on a second surface 4115 of the first dielectric body layer 4110 of the first interconnection structure layer 4100. Each of the outer connectors 4600 may have a solder ball shape. The outer connectors 4600 may be attached to contact the third contact portions 4191 of the second trace pattern 4190.

Figure 18:
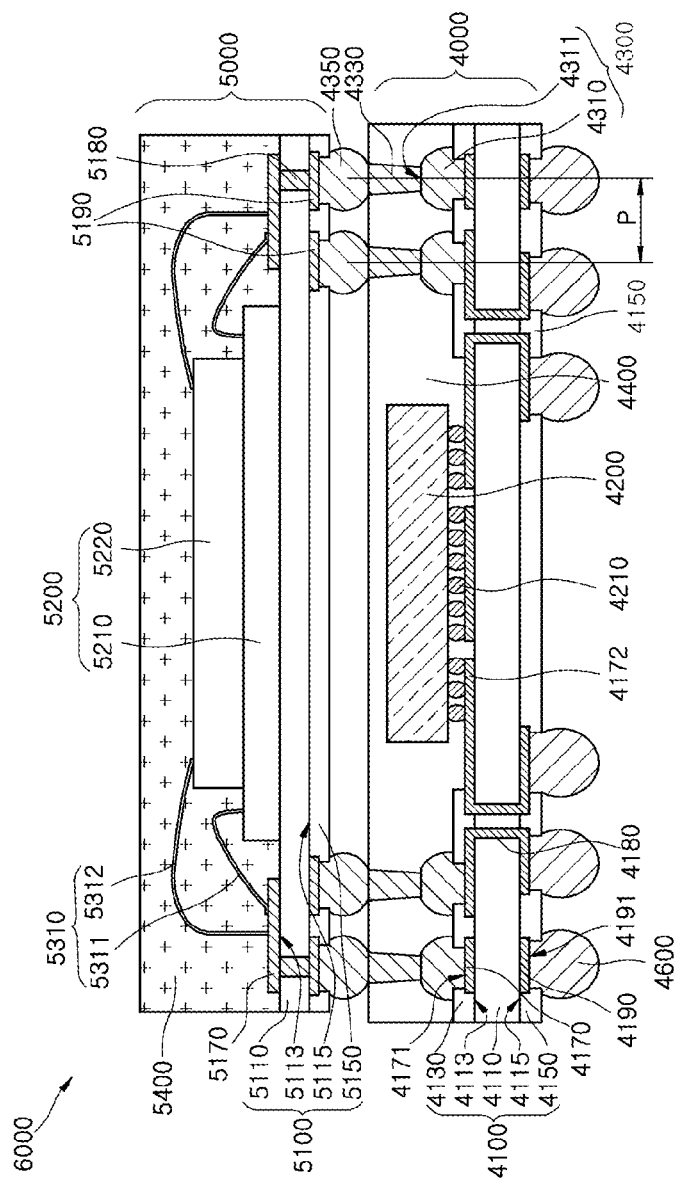

As shown in FIG. 18, a second semiconductor package portion 5000 may be formed. The second semiconductor package portion 5000 may be formed as a package to be laminated on the first semiconductor package portion 4000. The second semiconductor package portion 5000 may have a structure in which a second semiconductor chip 5200 is mounted on a second interconnection structure layer 5100. The second interconnection structure layer 5100 may be a member providing wiring circuits for electrically connecting the second semiconductor chip 5200 to the first semiconductor package portion 4000 or to external devices. The second semiconductor chip 5200 may be electrically or signally connected to the second interconnection structure layer 5100. The second interconnection structure layer 5100 may have a PCB shape including wiring circuits on an insulating substrate. The second interconnection structure layer 5100 may be an interposer including wiring circuits disposed on a silicon substrate or an organic substrate. Alternatively, the second interconnection structure layer 5100 may be a built up interconnection structure including wiring circuits on a multi-layered dielectric layer structure.

The second interconnection structure layer 5100 may include a second dielectric body layer 5110 in the center, and may include a third trace pattern 5170 of a conductive pattern such as a wiring circuit structure on a third surface 5113 of the second dielectric body layer 5110. A second chip connecting connector 5310 may contact and be fixed to the third trace pattern 5170 provided on the third surface 5113 of the second dielectric body layer 5110. The second chip connecting connector 5310 may electrically connect the second interconnection structure layer 5100 to the second semiconductor chip 5200.

An upper second semiconductor chip 5220 may be laminated on a lower second semiconductor chip 5210 as a third semiconductor chip, or more third semiconductor chips may be laminated, thus the second semiconductor chip 5200 may have a multi-layered lamination structure. The second chip connecting connector 5310 may include a second chip connecting first connector 5311 directly connecting the lower second semiconductor chip 5210 to the third trace pattern 5170, and a second chip connecting second connector 5312 directly connecting the upper second semiconductor chip 5220 to the third trace pattern 5170. The second chip connecting connector 5310 may have a bonding wire shape. Although not illustrated, the second chip connecting connector 5310 may also be introduced in a bump fix structure.

Fourth trace patterns 5190 for wiring circuits may be provided on a fourth surface 5115 opposite the third surface 5113 of the second dielectric body layer 5110 of the second interconnection structure layer 5100. A portion of a surface of each of the fourth trace patterns 5190 may be left exposed by the third dielectric layer 5150 for electrically connecting the first semiconductor package portion 4000 or to external devices. Conductive second inner trace patterns 5180 may be provided in the second dielectric body layer 5110 to electrically connect the third trace pattern 5170 to the fourth trace pattern 5190. The conductive second inner trace pattern 5180 may have a shape of a conductive via which substantially penetrates the second dielectric body layer 5110.

The second semiconductor package portion 5000 may be formed by disposing the second semiconductor chip 5200 on the second interconnection structure layer 5100 and forming a second mold layer 5400 to cover the second semiconductor chip 5200.

As shown in FIG. 18, the second interconnection structure layer 5100 of the second semiconductor package portion 5000 may be electrically and mechanically connected to the conductive vias 4330 of the first semiconductor package portion 4000 using second bumps 4350. Accordingly, a semiconductor package 6000 including a PoP package structure in which the second semiconductor package portion 5000 is laminated on the first semiconductor package portion 4000 via the TMCs 4300 can be formed. Each of the second bumps 4350 may have a solder ball shape. Each of the second bumps 4350 may have a ball shape having the substantially same size or same diameter as the first bump 4310.

Since the conductive via 4330 forming the TMC 4300 can have a small diameter and can be disposed in a greater number, the second semiconductor chip 4200 can be disposed directly and electrically connected to the conductive vias 4330. In addition, in FIG. 18, though the structure is exemplified such that the second semiconductor package portion 5000 is laminated to be electrically connected to the conductive vias 4330, the structure can be modified so that the second semiconductor package portion 5000 is disposed at a position of the first interconnection structure layer 4100, and the first interconnection structure layer 4100 is disposed to be connected to the conductive vias 4330.

Referring to FIG. 18 again, the semiconductor package 6000 may include a first semiconductor chip 4200 and a plurality of the first bumps 4310 that are disposed on the first interconnection structure layer 4100, and may include a first mold layer 4400 providing shapes of a plurality of trenches that bury the first semiconductor chip 4200 and leave exposed top portions 4311 of the first bumps 4310. A dielectric layer (4501 of FIG. 17) is provided to fill the trenches (4410 of FIG. 14) and to provide shapes of the opening holes (4503 of FIG. 17) that leave exposed the top portions 4311 of the first bumps 4310, and conductive vias 4330 may be provided to fill the opening holes (4503 of FIG. 17) and to be connected to each of the first bumps 4310. The semiconductor package 6000 may include a second semiconductor chip 5200 laminated to be electrically connected to the conductive vias 4330.

The TMC 4300 including the conductive vias 4330 laminated on the first bumps 4310 may be provided in the semiconductor package 6000 to substantially penetrate the multi-layered mold structure 4400 and 4501. The first bumps 4310 and conductive vias 4330 forming the TMC 4300 can have a small diameter, thus the TMCs 4300 can be provided in the semiconductor package 6000 with a smaller pitch interval P. The TMC 4300 may be made by laminating solder ball shapes and conductive vias, unlike known through mold via (TMV). Since the known TMV structure is formed by forming via holes (not illustrated) penetrating a mold layer using laser drilling, a long process time may be taken to form a large number of the TMVs to have a fine diameter. On the other hand, since the TMCs 4300 can be formed by attaching a large number of solder balls and patterning the photosensitive filling dielectric layer 4501 filling the trenches using a photolithography process, the TMCs 4300 can be implemented within a relatively short process time.

Figure 19:
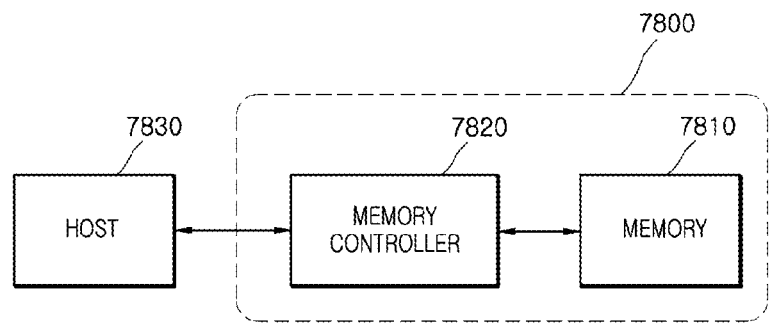
FIG. 19 is a block diagram illustrating an electronic system employing a memory card including a package in accordance with an embodiment.

FIG. 19 is a block diagram illustrating an electronic system including a memory card 7800 including at least one semiconductor package according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the present invention is applied. The memory controller 7820 may control the memory 7810 such that stored data is read out or data is stored in response to a read/write request from a host 7830.

Figure 20:
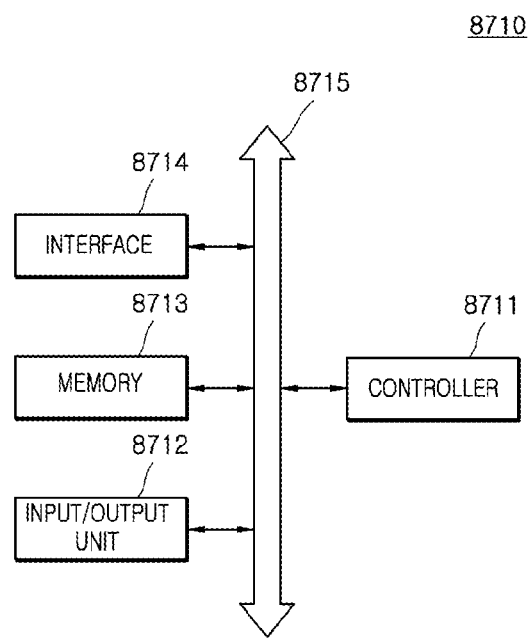
FIG. 20 is a block diagram illustrating an electronic system including a package according to an embodiment.

FIG. 20 is a block diagram illustrating an electronic system 8710 including at least one package according to an embodiment. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more of a microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system such as CDMA (code division multiple access), GSM (global system for mobile communications), NADC (north American digital cellular), E-TDMA (enhanced-time division multiple access), WCDAM (wideband code division multiple access), CDMA2000, LTE (long term evolution), and Wibro (wireless broadband Internet).

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A method for manufacturing a semiconductor package, the method comprising:
    disposing a first semiconductor chip and a plurality of first bumps on a first interconnection structure layer;
    forming a first mold layer covering the first bumps and the first semiconductor chip;
    exposing top portions of the first bumps by selectively removing some portions of the first mold layer;
    disposing second bumps connected to the exposed first bumps;
    forming a second mold layer covering the second bumps;
    exposing top portions of the second bumps by recessing the second mold layer; and
    laminating a second semiconductor chip electrically connected to the second bumps,
    wherein removing the portion of the first mold layer comprises forming a step shape at the first mold layer by leaving a remaining region of the first mold layer which covers the first semiconductor chip, and by selectively grinding a region of the first mold layer which covers the first bumps.

2. The method of claim 1, wherein the first bumps are disposed to have a height lower than the arrangement height of the first semiconductor chip.

3. The method of claim 1, wherein the grinding is performed to remove the top portion of the first bumps by a predetermined thickness.

4. The method of claim 1, wherein the second bumps are laminated on the first bumps to be overlapped with the first bumps.

5. The method of claim 1, wherein the first and second bumps have ball shape.

6. The method of claim 1, wherein the first and second bumps include a solder ball having substantially the same diameter.

7. The method of claim 1, wherein a height of the laminated second bump and first bump is higher than an arrangement height of the first semiconductor chip.

8. The method of claim 1, wherein recessing the second mold layer is performed to remove a predetermined thickness of the second mold layer to expose top portion of the second bumps.

9. The method of claim 1, wherein recessing the second mold layer includes grinding the entire region of the second mold layer.

10. The method of claim 1, wherein the first interconnection structure layer includes a printed circuit board (PCB) or an interposer.

11. The method of claim 1, wherein laminating the second semiconductor chip comprises:
    disposing the second semiconductor chip on a second interconnection structure layer;
    forming a third mold layer covering the second semiconductor chip; and
    electrically connecting the second bumps to the second interconnection structure layer.

12. The method of claim 11, wherein electrically connecting the second bumps to the second interconnection structure layer comprises:
    attaching third bumps for electrical connection to the second interconnection structure layer; and
    fixing the third bumps to the exposed top portions of the second bumps.

13. The method of claim 11, further comprises laminating a third semiconductor chip on the second semiconductor chip.

14. The method of claim 11,
    wherein the semiconductor package has a package on package (PoP) structure, the PoP structure includes a first semiconductor package portion including the first interconnection structure layer and the first semiconductor chip and a second semiconductor package portion including the second interconnection structure layer and the second semiconductor chip, and the second semiconductor package portion is electrically connected to the first semiconductor package portion by a through mold connector including the second bumps laminated on the first bumps.

15. A method for manufacturing a semiconductor package, the method comprising:
    forming a first mold layer burying a first semiconductor chip and a plurality of first bumps on a first interconnection structure layer;
    forming a plurality of trenches exposing top portions of the first bumps by selectively removing some portions of the first mold layer;
    forming a dielectric layer filling the trenches;
    forming opening holes exposing the top portions of the first bumps by selectively removing some portions of the dielectric layer;
    forming conductive vias connected to the first bumps by filling the opening holes; and
    laminating a second semiconductor chip electrically connected to the conductive vias.

16. A method for manufacturing a semiconductor package, the method comprising:
forming a first mold layer to cover a first semiconductor chip and a plurality of first bumps spaced apart from the first semiconductor chip in a lateral direction;
exposing top portions of the first bumps by selectively removing some portions of the first mold layer;
disposing second bumps connected to the exposed first bumps;
forming a second mold layer to cover the second bumps; and
forming a through mold connector by recessing the second mold layer and by exposing the top portions of the second bumps, the through mold connector including the second bumps disposed on the first bumps and substantially penetrating the first and second mold layers,
wherein removing the portion of the first mold layer comprises forming a step shape at the first mold layer by leaving a remaining region of the first mold layer which covers the first semiconductor chip, and by selectively grinding a region of the first mold layer which covers the first bumps.

17. The method of claim 16, further comprises laminating a second semiconductor chip electrically connected to the second bumps or to the first bumps.

18. The method of claim 16, further comprises electrically connecting a first interconnection structure layer to the first bumps.

19. The method of claim 16, further comprising:
disposing a second semiconductor chip on a second interconnection structure layer;
forming a third mold layer to cover the second semiconductor chip; and
electrically connecting the second bumps to the second interconnection structure layer by a third bumps.

* * * * *